(12) United States Patent
Briggs et al.

(10) Patent No.: US 9,806,023 B1
(45) Date of Patent: Oct. 31, 2017

(54) SELECTIVE AND NON-SELECTIVE BARRIER LAYER WET REMOVAL

(71) Applicant: International Business Machines Corporation, Armonk, NY (US)

(72) Inventors: Benjamin D. Briggs, Waterford, NY (US); Elbert E. Huang, Carmel, NY (US); Raghuveer R. Patlolla, Guilderland, NY (US); Cornelius B. Peethala, Albany, NY (US); David L. Rath, Stormville, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/444,599

(22) Filed: Feb. 28, 2017

Related U.S. Application Data

(63) Continuation of application No. 15/131,157, filed on Apr. 18, 2016, now Pat. No. 9,685,406.

(51) Int. Cl.
*H01L 23/52* (2006.01)
*H01L 21/4763* (2006.01)
(Continued)

(52) U.S. Cl.
CPC ...... *H01L 23/5283* (2013.01); *H01L 23/5226* (2013.01); *H01L 23/53238* (2013.01); *H01L 23/53295* (2013.01)

(58) Field of Classification Search
CPC ......... H01L 21/76843; H01L 21/76846; H01L 21/76847; H01L 21/76877;
(Continued)

(56) References Cited

U.S. PATENT DOCUMENTS

| 6,001,730 A | 12/1999 | Farkas et al. |
| 6,638,326 B2 | 10/2003 | Small et al. |

(Continued)

FOREIGN PATENT DOCUMENTS

| EP | 1401015 A1 | 3/2004 |
| WO | 02068717 A1 | 9/2002 |

OTHER PUBLICATIONS

List of IBM Patents or Patent Applications Treated as Related.

*Primary Examiner* — Hsien Ming Lee
(74) *Attorney, Agent, or Firm* — Vazken Alexanian; Ryan, Mason & Lewis, LLP

(57) ABSTRACT

A method for manufacturing a semiconductor device includes forming a dielectric layer on a substrate, forming a plurality of openings in the dielectric layer, conformally depositing a barrier layer on the dielectric layer and on sides and a bottom of each one of the plurality of openings, depositing a contact layer on the barrier layer in each one of the plurality of openings, removing a portion of each contact layer from each one of the plurality of openings, and removing a portion of the barrier layer from each one of the plurality of openings, wherein at least the removal of the portion of the barrier layer is performed using an etchant including: (a) a compound selected from group consisting of -azole, -triazole, and combinations thereof; (b) a compound containing one or more peroxy groups; (c) one or more alkaline metal hydroxides; and (d) water.

20 Claims, 9 Drawing Sheets

(51) Int. Cl.
*H01L 23/528* (2006.01)
*H01L 23/532* (2006.01)
*H01L 23/522* (2006.01)

(58) Field of Classification Search
CPC ........... H01L 21/76883; H01L 23/5226; H01L 23/5336; H01L 23/53238; H01L 2924/01079
USPC ....... 438/627, 629, 631, 633, 637, 643, 645, 438/687; 257/751, 752, 762, 774
See application file for complete search history.

(56) References Cited

U.S. PATENT DOCUMENTS

| | | |
|---|---|---|
| 6,852,136 B2 | 2/2005 | Park et al. |
| 6,858,540 B2 | 2/2005 | Sun et al. |
| 6,939,795 B2 | 9/2005 | Eissa et al. |
| 7,323,416 B2 | 1/2008 | Liu et al. |
| 9,012,322 B2 | 4/2015 | Duong et al. |
| 9,275,874 B2 | 3/2016 | Tanwar |
| 2002/0119245 A1 | 8/2002 | Verhaverbeke |
| 2006/0189134 A1 | 8/2006 | Cotte et al. |
| 2006/0226122 A1 | 10/2006 | Wojtczak et al. |
| 2009/0101864 A1 | 4/2009 | Song et al. |
| 2013/0299994 A1* | 11/2013 | Park ................ H01L 21/76883 257/774 |
| 2015/0130065 A1 | 5/2015 | Duong et al. |
| 2016/0020087 A1 | 1/2016 | Liu et al. |
| 2016/0049364 A1 | 2/2016 | Edelstein et al. |

\* cited by examiner

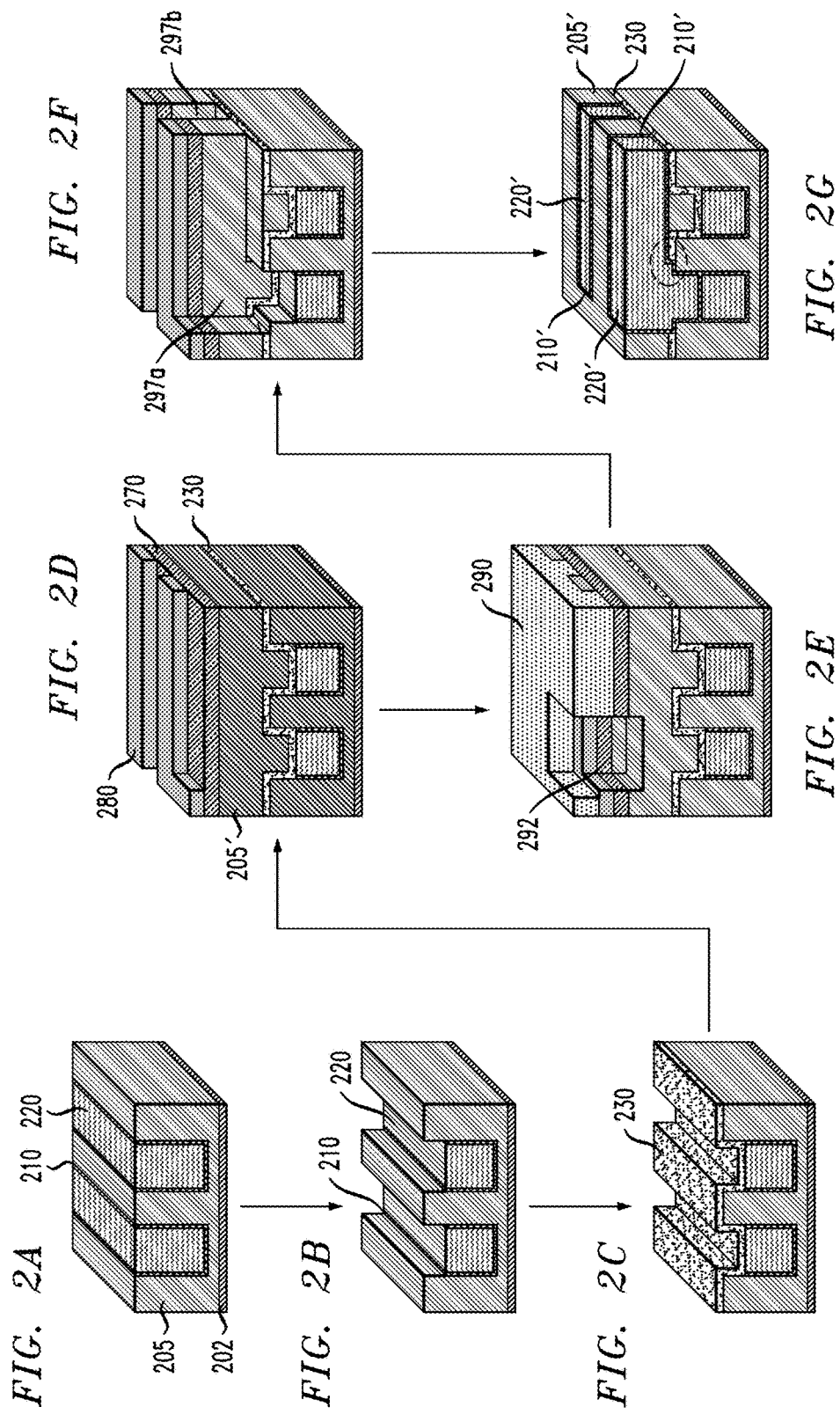

310

320

330

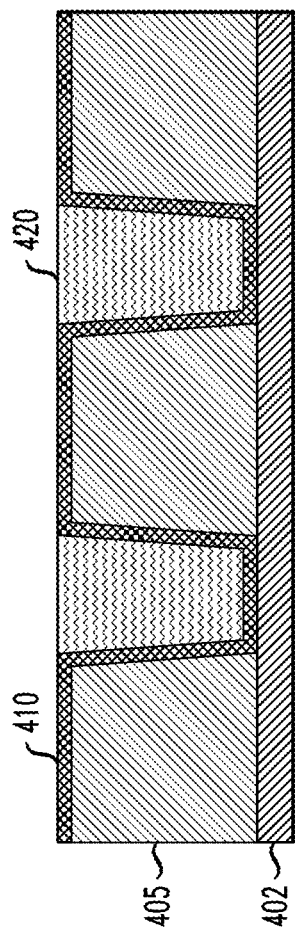
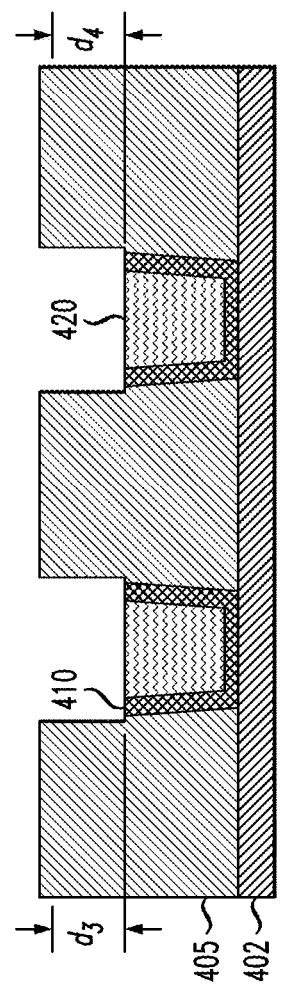

510

520

530

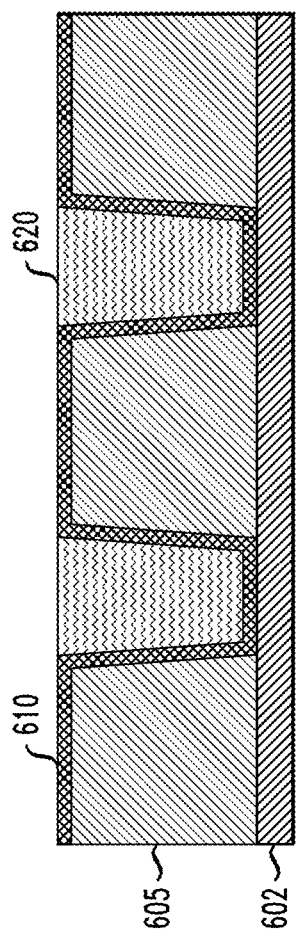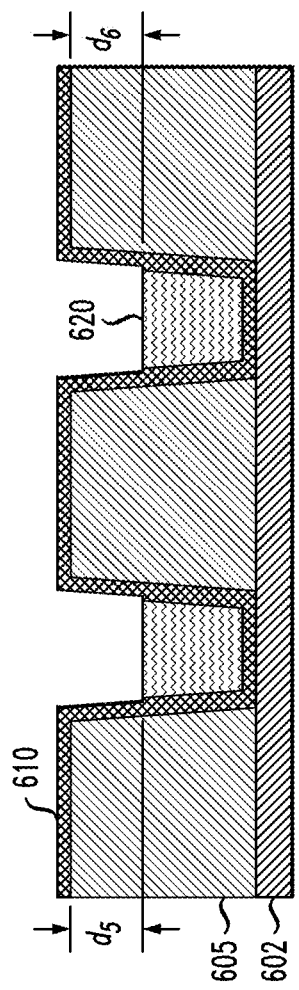

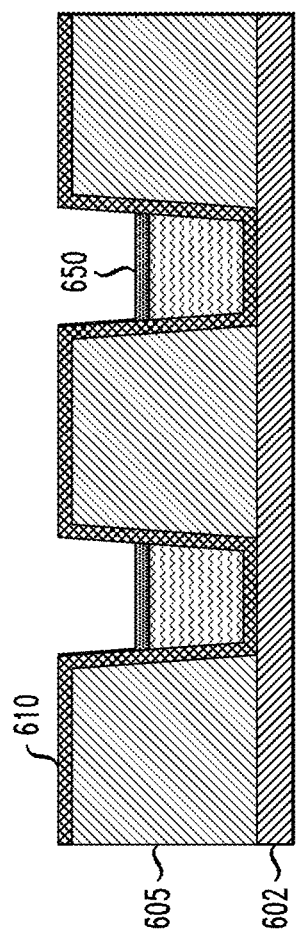
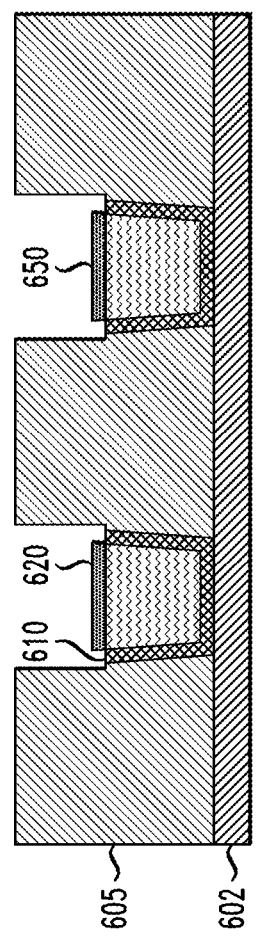

US 9,806,023 B1

SELECTIVE AND NON-SELECTIVE BARRIER LAYER WET REMOVAL

TECHNICAL FIELD

The field generally relates to semiconductor devices and methods of manufacturing same and, in particular, to selective and non-selective removal of a barrier layer during fabrication of a semiconductor device having fully aligned vias (FAVs).

BACKGROUND

Very-Large Scale Integrated (VLSI) circuits and Ultra-Large Scale Integrated (ULSI) circuits include interconnect structures having electrically conductive wires that connect devices in different levels of a semiconductor chip to each other. The conductive interconnects include metals, such as, for example, aluminum or copper, insulated by dielectric materials. Trends in the semiconductor industry have led to reduced gate length and chip size, resulting in smaller interconnect structures. As the interconnect structures decrease in size, overlay error between elements in the interconnect structure caused by misalignment during a lithography process, and the resulting reliability issues, have become areas of concern to semiconductor manufacturers.

Processing to form metal interconnects or vias that are fully aligned to a first metallization level (M1) and a second metallization level (M2) on the first metallization level has been attempted. The fully aligned metal interconnects are referred to herein as fully aligned vias (FAVs). In connection with FAV processing, topography from an underlying metal is used to define a via in a non-self-aligned via (non-SAV) direction. Using the topography from an underlying metal to define a via in a non-SAV direction can be very challenging where the underlying level has certain structures that may be difficult to recess.

SUMMARY

According to an exemplary embodiment of the present invention, a method for manufacturing a semiconductor device includes forming a dielectric layer on a substrate, forming a plurality of openings in the dielectric layer, conformally depositing a barrier layer on the dielectric layer and on sides and a bottom of each one of the plurality of openings, depositing a contact layer on the barrier layer in each one of the plurality of openings, removing a portion of each contact layer from each one of the plurality of openings, and removing a portion of the barrier layer from each one of the plurality of openings, wherein at least the removal of the portion of the barrier layer is performed using an etchant including: (a) a compound selected from group consisting of -azole, -triazole, and combinations thereof; (b) a compound containing one or more peroxy groups; (c) one or more alkaline metal hydroxides; and (d) water.

According to an exemplary embodiment of the present invention, a semiconductor device includes a dielectric layer on a substrate, an opening in the dielectric layer, a first interconnect structure partially filling the opening in the dielectric layer, wherein the first interconnect structure comprises a first barrier layer lining a bottom of the opening and sides of the opening up to a predetermined height below a top of the opening, and a first contact layer on the barrier layer in each one of the plurality of openings, wherein the first contact layer fills the opening to the predetermined height below the top of the opening. The semiconductor device further includes a second interconnect structure on the first interconnect structure, wherein at least part of the second interconnect structure is in the opening, and includes a second contact layer on a second barrier layer.

According to an exemplary embodiment of the present invention, a method for manufacturing a semiconductor device includes forming a dielectric layer on a substrate, forming an opening in the dielectric layer, conformally depositing a barrier layer on the dielectric layer and on sides and a bottom of the opening, depositing a contact layer on the barrier layer in the opening, removing a portion of the contact layer from the opening, and removing a portion of the barrier layer from the opening, wherein at least the removal of the portion of the barrier layer is performed using an etchant including: (a) a compound selected from group consisting of -azole, -triazole, and combinations thereof; (b) a compound containing one or more peroxy groups; (c) one or more alkaline metal hydroxides; and (d) water.

According to an exemplary embodiment of the present invention, an etching composition includes (a) a compound selected from group consisting of -azole, -triazole, and combinations thereof; (b) a compound containing one or more peroxy groups; (c) one or more alkaline metal hydroxides; and (d) water. The etching composition may further include one or more bidentate or tridentate copper complexants such as, for example, an aminocarboxylic acid, an aminophosphonic acid, a dicarboxylic acid, a tricarboxylic acid, a diphosphonic acid, a triphosphonic acid, a carboxyphosphonic acid, or a combination thereof. The etching composition may further include a peroxide stabilizer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIGS. 2A-2G are three-dimensional views illustrating a method of manufacturing a semiconductor device including FAVs according to an exemplary embodiment of the present invention.

FIGS. 4A-4B are cross-sectional views illustrating a method of manufacturing a semiconductor device including FAVs according to an exemplary embodiment of the present invention.

FIGS. 6A-6E are cross-sectional views illustrating a method of manufacturing a semiconductor device including FAVs according to an exemplary embodiment of the present invention.

DETAILED DESCRIPTION

Figure 1A:
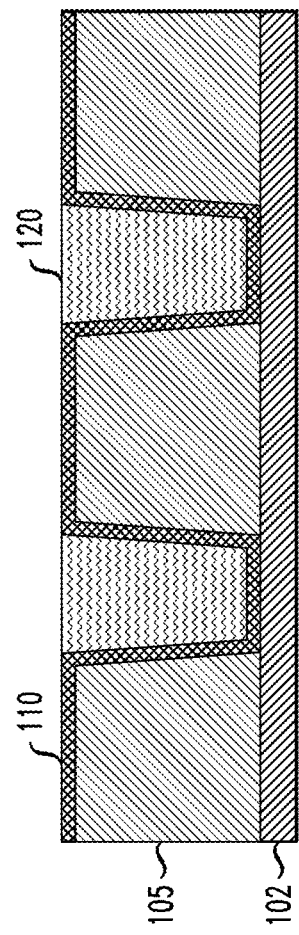
FIGS. 1A-1D are cross-sectional views illustrating a method of manufacturing a semiconductor device including fully aligned vias (FAVs) according to an exemplary embodiment of the present invention.

Exemplary embodiments of the invention will now be discussed in further detail with regard to semiconductor devices and methods of manufacturing same and, in particular, to removal of a barrier layer during fabrication of a semiconductor device having FAVs.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices in which aligned contacts may be used, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

As used herein, "height" refers to a vertical size of an element (e.g., a layer, trench, hole, etc.) in the cross-sectional and three-dimensional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the cross-sectional views.

As used herein, "width" or "length" refers to a size of an element (e.g., a layer, trench, hole, etc.) in the figures measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional and three-dimensional views, and "horizontal" refers to a direction parallel to a substrate in the cross-sectional and three-dimensional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention provide a specific method for achieving a fully aligned via landing on a metal interconnect structure including a metal contact and a barrier layer around the metal contact. For example, in accordance with an embodiment of the present invention, the metal contact includes, but is not necessarily limited to, copper (Cu) and the barrier layer includes, but is not necessarily limited to, tantalum nitride (TaN). In connection with defining a via in a non-SAV direction by using the topography from an underlying metal interconnect structure including, for example, a Cu metal contact and a TaN/Ta barrier layer, the Cu can be selectively removed to form a recess using, for example, standard clean-1/dilute hydrofluoric acid (SC1/dHF), but there is no known wet or dry process available for selective removal of a TaN barrier layer. As is known, SC1, can be performed using deionized water, aqueous $NH_4OH$ (ammonium hydroxide) and aqueous $H_2O_2$ (hydrogen peroxide). SC1 can be used in the range of 100:1:1 to 5:1:1 (deionized water:hydrogen peroxide:ammonium hydroxide). As is known, dHF is dilute hydroflouric acid and it can be used in the range of 100:1 to 10000:1 (DIW:HF (49 wt %).

An exemplary embodiment of the present invention provides for the selective removal of a barrier layer, such as, for example, TaN, with respect to Cu, cobalt (Co), ruthenium (Ru) and ultra-low K dielectrics (ULKs). An exemplary embodiment of the present invention provides for the non-selective removal of a barrier layer, such as, for example, TaN, with respect to Cu, and the selective removal of the TaN barrier layer and Cu with respect to Co, Ru and ULKs. In accordance with exemplary embodiments of the present invention, alkali metal hydroxides when mixed with hydrogen peroxide are used to perform the selective etching of TaN, and alkali metal hydroxides in combination with hydrogen peroxide, $NH_4OH$ or any Cu complexing agents, are used to etch both TaN and Cu selective to Co, Ru and ULKs. Selectivity can be tuned by varying concentrations of the components. In accordance with an exemplary embodiment of the present invention, the addition of triazole to the above chemistries and buffer pH at ~9 increases selectivity to cobalt.

FIGS. 1A-1D are cross-sectional views and FIGS. 2A-2G are three-dimensional views illustrating a method of manufacturing a semiconductor device including fully aligned vias (FAVs) according to an exemplary embodiment of the present invention. Referring to FIGS. 1A and 2A, a semiconductor substrate 102 or 202 may comprise semiconductor material including, but not limited to, Si, silicon germanium (SiGe), silicon carbide (SiC), silicon germanium carbide (SiGeC), III-V, II-V compound semiconductor or other like semiconductor. In addition, multiple layers of the semiconductor materials can be used as the semiconductor material of the substrate.

In accordance with an embodiment of the present invention, as can be seen in FIGS. 1A and 2A a dielectric layer 105 or 205, which can be, for example, an interlayer dielectric layer ("ILD") is deposited on the substrate 102 using, for example, deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The dielectric layer 105 or 205 may include, but is not limited to, ULK materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4. The dielectric layer 105 or 205 may have a vertical thickness ranging from about 20 nm to about 200 nm.

Interconnect structures including a barrier layer 110 or 210 and an electrically conductive contact 120 on the barrier layer 110, or an electrically conductive contact 220 on the barrier layer 210 are formed in openings in the dielectric layer 105 or 205, using, for example, a single or dual damascene technique. In accordance with an embodiment of the present invention, the barrier layers 110, 210 are conformally deposited on portions of the dielectric layers 105, 205 using deposition techniques including, but not limited to, CVD, PECVD, RFCVD, PVD, ALD, MBD, PLD, and/or LSMCD, sputtering, and/or plating, and then the electrically conductive contacts 120, 220 are respectively deposited on the barrier layers 110, 210 using, for example, one or more of the above-noted deposition techniques. According to an embodiment of the present invention, the barrier layers 110, 210 comprise TaN. Other materials for the barrier layers 110, 210 can include, but are not necessarily limited to, Ta, titanium (Ti), titanium nitride (TiN) and a bilayer of TaN/Ta, which, like TaN, can be selectively and non-selectively removed in accordance with embodiments of the present invention described herein. According to an embodiment of the present invention, the contacts 120, 220 comprise copper, cobalt and/or ruthenium.

Liner layers (not shown), such as, for example, cobalt or ruthenium can be positioned between the barrier and contact layers. For example, cobalt can be present in thin layers as a liner layer (e.g., 1 to 100 angstroms) between a TaN barrier layer, and a Cu contact layer. When cobalt or another liner layer is present, the liner layer can be removed during the contact removal step in, for example, the SC1/dHF process.

After deposition of the contacts 120, 220, a planarization process, such as, chemical mechanical planarization (CMP), is performed to planarize an upper surface of the dielectric layer 105. Referring to FIG. 1A, in accordance with an embodiment of the present invention, the planarization can be down to the barrier layer 110 so that a planarized barrier layer 110 remains on a top surface of the dielectric layer 105, as well as on side and bottom surfaces of the openings in the dielectric layer 105 where the contacts 120 are formed. A thickness of the barrier layer 110 on a top surface of the dielectric layer 105, as well as on side and bottom surfaces of the openings in the dielectric layer 105 can be in the range of about 0.5 nm to about 10 nm. Alternatively, referring to FIG. 2A, the planarization can be down to the dielectric layer 205 so that the barrier layer 210 remains on side and bottom surfaces of the openings in the dielectric layer 205 where the contacts 220 are formed, and not on a top surface of the dielectric layer 205. A thickness of the barrier layer 210 on side and bottom surfaces of the openings in the dielectric layer 205 can be in the range of about 0.5 nm to about 10 nm.

Figure 1B:
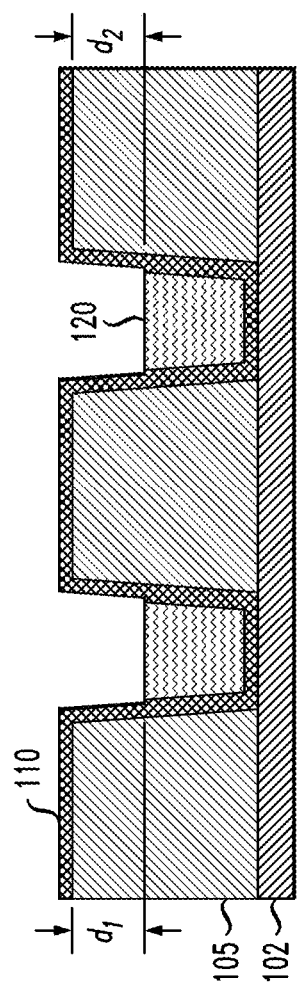

Referring to FIG. 1B, the contact portions 120 (e.g., copper) are recessed in the openings in the dielectric layer 105 using, for example, SC1/dHF. As an alternative to using SC1/dHF, the contact portions 120 may recessed by an etching technique, such as, for example, wet etches, including chemistries having an oxidizer, such as, for example, hydrogen peroxide, Cu complexing agent, such as, for example amino acids, carboxylic acids.

As can be seen in FIG. 1B, according to an embodiment of the present invention, the contacts 120 are recessed selective to the barrier layer 110 so that the barrier layer 110 remains adjacent areas where the contacts 120 were removed. The contacts 120 are also recessed selective to the dielectric layer 105 and may be recessed to depths ($d_1$, $d_2$), respectively from a top surface of the dielectric layer 105. The first recessed depth ($d_1$) may be the same as the second depth ($d_2$), and may range from about 5 nm to 50 nm. The contact 120 of each opening may be recessed at the same time.

Figure 1C:
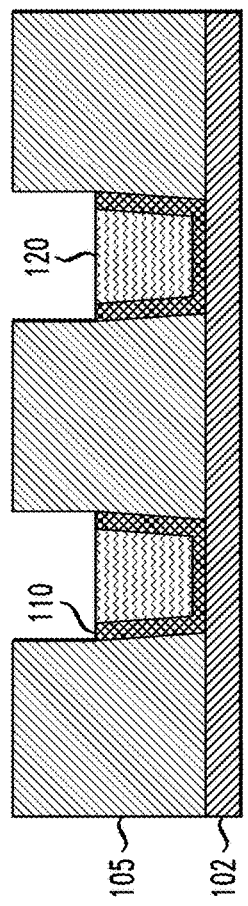

Referring to FIG. 1C, after recessing of the contacts 120 (e.g., copper contacts), the barrier layer 110 (e.g., TaN) is removed from the top surface of the dielectric layer 105 and from the portions of the openings down to depths $d_1$ and $d_2$. The removal of the barrier layer 110 is selective to the contact layers 120 (e.g., Cu) and the dielectric layer 105 (e.g., ULK material). According to an embodiment of the present invention, the barrier layer 110 is selectively etched using, for example, 15% $H_2O_2$ (hydrogen peroxide)+10 g/L (grams/liter) BTA (Benzotriazole)+0.5 g/L CDTA (cyclohexanediamininetetraaceticacid)+KOH (potassium hydroxide) in deionized (DI) water at a pH in the range of about 4 to about 12. Etching can be performed at a temperatures ranging from about 25° C. to about 70° C. Other possible variations for etch chemistry include, but are not necessarily limited to:

(a) Replacing KOH by another alkaline metal hydroxide, such as, for example, one of LiOH, NaOH, RbOH, CsOH, and combinations thereof, at concentration ranges of about 0.001M to about 0.1M (molar);

(b) Replacing hydrogen peroxide by another compound containing one or more peroxy groups, such as, for example, one of perborate salts, percarbonate, urea-hydrogen peroxide, and combinations thereof, at concentration ranges of about 1% to about 20%;

(c) Replacing CDTA by another peroxide stabilizer, such as, for example, one of diethylenetriaminepenta(methylenephosphonic acid) (DTPMPA), and ethylenediaminetetraacetic acid (EDTA) at concentration ranges of about 0.1 g/L to about 1 g/L; and (d) Replacing BTA by another corrosion inhibitor, such as, for example, one of 1,2,3 triazole, 1,3,4 triazole, 1,2,4 triazole, imidazole, methyl-thiol-triazole, thiol-triazole, triazole acid, 5-methyl-1H-benzotriazole, at concentration ranges of about 0.1 g/L to about 10 g/L.

In addition to selectively etching TaN with respect to copper and ULK materials, the etch chemistry described in connection with FIG. 1C, also selectively etches TaN with respect to cobalt and ruthenium, so that a barrier layer comprising TaN can be selectively removed with respect to a structure comprising copper, cobalt and/or ruthenium to result in the structure illustrated in FIG. 1C.

Figure 3A:
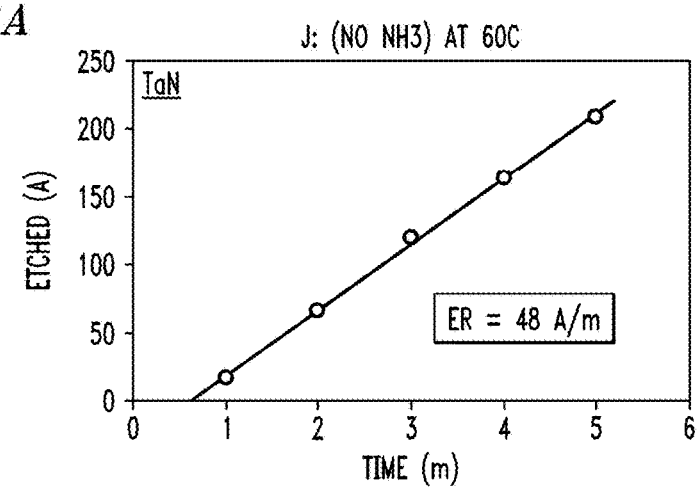
FIGS. 3A-3C are graphs illustrating etch rates for tantalum nitride, copper and cobalt, respectively, using an etch chemistry according to an exemplary embodiment of the present invention.
Figure 3B:
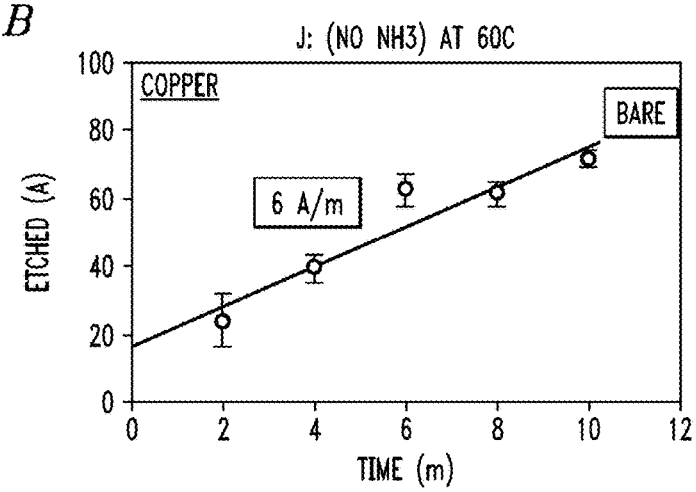
Figure 3C:
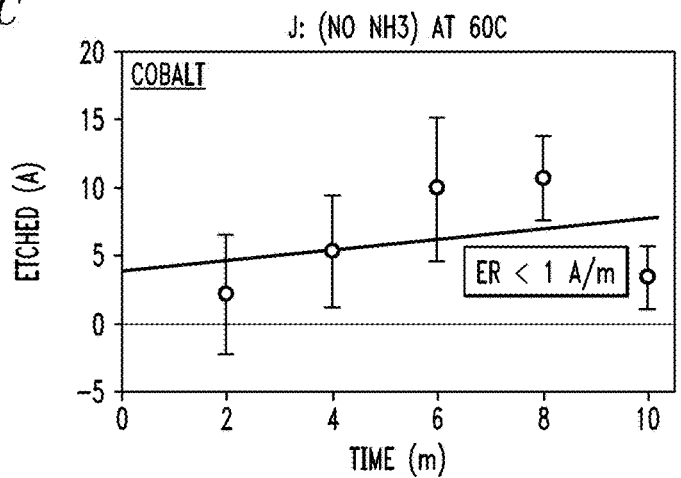

FIGS. 3A-3C are graphs illustrating etch rates for tantalum nitride, copper and cobalt, respectively, using the etch chemistry described in connection with FIG. 1C, according to an exemplary embodiment of the present invention. Referring to graph 310 in FIG. 3A, the etch rate of TaN at 60° C. using 15% $H_2O_2$+10 g/L BTA+0.5 g/L CDTA+KOH at a pH of 9 is approximately 48 angstroms/minute. Referring to graph 320 in FIG. 3B, the etch rate of copper under the same conditions as in FIG. 3A is approximately 6 angstroms/minute. Referring to graph 330 in FIG. 3C, the etch rate of cobalt under the same conditions as in FIG. 3A is approximately <1 angstrom/minute. Accordingly, when using the etch chemistry described in connection with FIG. 1C, the TaN:Cu wet etch selectivity is approximately 8:1, and the TaN:Co wet etch selectivity is approximately 48:1 or higher. Therefore, the TaN can be selectively etched with respect to Cu and Co. In addition, although not shown in the graphs, the ULK etch rate is <1 Å/min, so TaN:ULK is 48:1 or higher.

FIG. 2B illustrates a three-dimensional view of what is shown in FIG. 1C, and may be the result of selective removal of the barrier layer 210 after selective removal of top portions of the contact layers 220 using the same or similar processing steps described in connection FIGS. 1B and 1C. Alternatively, the structure in FIG. 2B can also represent the result of processing similar to that described below in connection with FIGS. 4A and 4B, where both the barrier and contact layers are simultaneously or substantially simultaneously removed selective to ULK materials, cobalt and/or ruthenium.

Figure 1D:
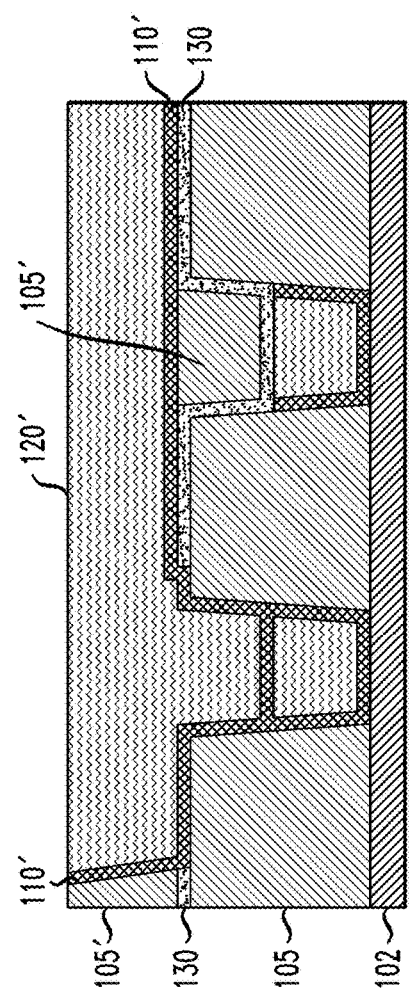

Processing to result in the structures illustrated in FIGS. 1D and 2G will now be described in connection with FIGS. 2C-2F. Referring to FIG. 2C, a cap layer 230 is formed on the structure of FIG. 2B. Similarly, a cap layer 130 is formed on the structure of FIG. 1C. As can be seen in FIG. 2C, the cap layer 230 may be deposited using a suitable deposition technique, such as, for example, CVD, PECVD, RFCVD, PVD, ALD, MBD, PLD, and/or LSMCD, sputtering, and/or plating, on the dielectric layer 205 and on the remaining interconnect structures comprising the barrier layer 210 and the metal contacts 220. The cap layer 230 can include a dielectric material, such as, for example, silicon nitride (SiN), silicon carbide (SiC), silicon carbonitride (SiCN), hydrogenated silicon carbide (SiCH), or other suitable material. The cap 230 can have a vertical thickness ranging from about 1 nm to about 30 nm. The cap 230 may function as an air and/or metal diffusion barrier or insulator, and may be used to improve interconnect reliability.

Referring to FIG. 2D, another dielectric layer 205' is formed on the cap layer 230. Dielectric layer 205' may comprise the same or similar materials as those of dielectric layers 105 and 205, and can also be referred to as an ILD layer. Dielectric layer 105' in FIG. 1D corresponds to dielectric layer 205'. Dielectric layer 205' may be formed using the same or similar deposition techniques as those used for forming dielectric layers 105 and 205, and may be planarized using, for example, CMP.

Referring to FIG. 2D, hardmasks 270 and 280 are sequentially formed on the dielectric layer 205'. The hardmask 270 may be a suitable masking material sacrificial in nature, such as, for example, a low-k silicon carbide (SiC), silicon carbonitride (SiCN) or silicon nitride (SiN). The hardmask 280 is formed on the hardmask 270, and may be a suitable masking material, such as, for example, titanium nitride (TiN). According to an embodiment, the hardmask 280 is a different material from the hardmask 270 to permit etching of the hardmask 280 selective to the hardmask 270, such that hardmask 280 is etched and the hardmask 270 functions as an etch stop. The hardmasks 270, 280 can be formed using a deposition technique, such as, for example, CVD, PECVD, RFCVD, PVD, ALD, MBD, PLD, and/or LSMCD, sputtering, and/or plating. According to an embodiment of the present invention, the hardmask 270 is deposited by a CVD process that does minimal or no damage to an underlying dielectric layer 205', and protects the dielectric layer 205' from plasma of a PVD deposition of the hardmask 280.

As shown in FIG. 2D, the hardmask 280 is etched into a trench pattern, using, for example, a reactive ion etch (RIE) process. As noted above, the hardmask 270 can function as an etch stop for the formation of the trench pattern, as portions of the hardmask 280 are removed selective to the hardmask 270 to pattern the hardmask into the trench pattern. As illustrated, the trench pattern formed from hardmask 280 extends perpendicular to, and overlaps at least a portion of the contacts 220.

Referring to FIG. 2E, a resist 290 is formed on the remaining portions of hardmask 280 and on portions of hardmask 270. The resist 290 can include masking materials that are used in lithography, such as, for example, organic resist coatings or patterning layers. The resist can be formed using, for example, spin coating and may include one or more layers. The resist 290 can have a thickness ranging from about 5 nm to 500 nm. A via pattern 292 is formed using the resist 290, along with lithography and patterning techniques.

As can be seen, the via pattern 292 is aligned with the left interconnect structure comprising the barrier and contact layers 210 and 220. Another via pattern can be formed to align with a portion of the right interconnect structure. Via patterns can be self-aligned by the hardmask 280 because of overlapping the hardmask 280 and a selective etching technique, where the resist 290 is etched selectively with respect to hardmask 280 using an etching technique, such as, for example, RIE.

In a non-limiting illustrative embodiment, as shown in FIG. 2E, a via pattern, such as via pattern 292, is formed through the hardmask 270 and partially through the dielectric layer 205'. Alternatively, a via pattern is formed through both the hardmask 270 and the dielectric layer 205', or formed partially through the hardmask 270 without reaching the dielectric layer 205'. A depth of a via pattern can be a function of etch selectivity of the materials used or a desired via depth.

Referring to FIG. 2F, the resist 290 is removed and trenches 297a and 297b are etched. The resist 290 is removed using, for example, RIE or stripping processes. The trenches 297a, 297b are formed based on the pattern of the hardmask 280, and can be etched using, for example, an RIE, or other etching process. The etching of the trenches 297a, 297b may be selective to the hardmask 280.

Referring to FIG. 2G, a next level of interconnect structures including barrier layers 210' and contact layers 220' is deposited in the first and second trenches 297a, 297b, respectively. Similarly, referring to FIG. 1D, a next level interconnect structure includes a barrier layer 110' and contact layer 120' deposited in a trench over the lower level interconnect structure including barrier and contact layers 110, 120. The barrier and contact layers 110', 210', 120', 220' can include different, the same or substantially the same materials as the barrier and contact layers 110, 210 and 120, 220. Accordingly, like the contact layers 120, 220, the contact layers 220' may include conductive materials, such as, for example, copper, cobalt and/or ruthenium, and the barrier layers 110', 210', like the barrier layers 110, 210, can comprise TaN, Ta, TaN/Ta, Ti and TiN. According to an embodiment of the present invention, the barrier layers 110, 110', 210, 210' each include TaN, and the contact layers 120, 120', 220, 220' comprise copper.

The next level interconnect structures are fabricated using the same or similar techniques to the lower level interconnect structures. For example, depending on the configuration of the trenches for receiving the next level interconnect structures, the barrier layers 110', 210' are conformally deposited on portions of the lower and upper level dielectric layers 105, 105' or 205, 205', and on portions of the lower level interconnect structures using deposition techniques including, but not limited to, CVD, PECVD, RFCVD, PVD, ALD, MBD, PLD, and/or LSMCD, sputtering, and/or plating. The electrically conductive contacts 120', 220' are respectively deposited on the barrier layers 110', 210' using, for example, one or more of the above-noted deposition techniques. Referring to FIGS. 1D and 2G, according to an embodiment of the present invention, the structure can be planarized down to the upper dielectric layer 105', 205', thereby removing hardmasks 270, 280.

According to an embodiment, referring to FIGS. 1D and 2G, a bottom portion of a next level interconnect structure is on an upper surface of a lower level interconnect structure, wherein an interface between the next level interconnect structure and the lower level interconnect structure is in an opening of the dielectric layer 105, 205 at a predetermined height below a top of the opening. The predetermined height can be, for example, at or near the depth to which the lower level interconnect structure was recessed.

FIGS. 4A-4B are cross-sectional views illustrating a method of manufacturing a semiconductor device including FAVs according to an exemplary embodiment of the present invention. FIG. 4A illustrates a structure and processing which are the same or similar to the structure and processing shown in FIG. 1A. In accordance with an embodiment of the present invention, as can be seen in FIG. 4A, a dielectric layer 405, like dielectric layer 105, is deposited on the substrate 402 using, for example, deposition techniques including, but not necessarily limited to, CVD, PECVD, RFCVD, PVD, ALD, MBD, PLD, LSMCD, sputtering, and/or plating.

Interconnect structures including a barrier layer 410 and an electrically conductive contact 420 on the barrier layer 410, the same or similar to barrier and contact layers 110, 120, are formed in openings in the dielectric layer 405, using, for example, the same or similar techniques as those described in connection with barrier and contact layers 110, 120. After deposition of the contacts 420, a planarization process, such as CMP, is performed down to the barrier layer 410 so that like the structure in FIG. 1A, a planarized barrier layer 410 remains on a top surface of the dielectric layer 405, as well as on side and bottom surfaces of the openings in the dielectric layer 405 where the contacts 420 are formed.

In accordance with the embodiment illustrated in FIG. 4B, the contact layer 420 comprises copper and the barrier layer 410 comprises TaN. Referring to FIG. 4B, after planarization described in connection with FIG. 4A, both the TaN barrier layer 410 and Cu contact layer 420 are selectively recessed in a single etching process using, for example, 15% $H_2O_2$+10 g/L BTA+0.1 M (moles) $NH_3$ (ammonia)+0.5 g/L CDTA+KOH in DI water at a pH range of about 4 to about 12. Etching can be performed at a temperature range of about 25° C. to about 70° C. As noted above, other possible variations for etch chemistry include, but are not necessarily limited to:

(a) Replacing KOH by another alkaline metal hydroxide, such as, for example, one of LiOH, NaOH, RbOH, CsOH, and combinations thereof, at concentration ranges of about 0.001M to about 0.1M (molar);

(b) Replacing hydrogen peroxide by another compound containing one or more peroxy groups, such as, for example, one of perborate salts, percarbonate, urea-hydrogen peroxide, and combinations thereof, at concentration ranges of about 1% to about 20%;

(c) Replacing CDTA by another peroxide stabilizer, such as, for example, one of diethylenetriaminepenta(methylene-phosphonic acid) (DTPMPA), and ethylenediaminetetraacetic acid (EDTA) at concentration ranges of about 0.1 g/L to about 1 g/L; and (d) Replacing BTA by another corrosion inhibitor, such as, for example, one of 1,2,3 triazole, 1,3,4 triazole, 1,2,4 triazole, imidazole, methyl-thiol-triazole, thiol-triazole, triazole acid, 5-methyl-1H-benzotriazole, at concentration ranges of about 0.1 g/L to about 10 g/L.

$NH_3$ (ammonia) in water can be from one of the sources $NH_4OH$ (ammonium hydroxide), ammonium phosphate, or ammonium dihydrogen phosphate. Other complexing agents such as, bidentate or tridentate copper complexants including amino carboxylic acids (amino acids), amino phosphonic acids, di and tri-carboxylic acids, di and tri-phosphonic acids, carboxyphosphonic acids, or combinations thereof, can be used in place of $NH_3$ (ammonia).

This etch chemistry selectively etches both TaN and Cu with respect to ULK materials, and also selectively etches TaN and Cu with respect to cobalt and ruthenium, so that a barrier layer comprising TaN and a contact layer comprising copper can both be selectively removed in the same etch step with respect to ULK materials and/or cobalt and ruthenium, to result in the structure illustrated in FIG. 4B. According to an embodiment of the present invention, the ammonia is added via $NH_4OH$ (ammonium hydroxide), and etch selectivity of TaN with respect to Cu can be altered by modifying amounts of ammonia. Referring to FIG. 4B, the barrier and contact layers 410 and 420 are removed from a top surface of the dielectric layer 405 and from portions of openings in the dielectric layer 405 down to depths $d_3$ and $d_4$ measured from a top surface of the dielectric layer 405. The recessed depth ($d_3$) may be the same as the depth ($d_4$), and may range from about 5 nm to 50 nm.

Figure 5A:
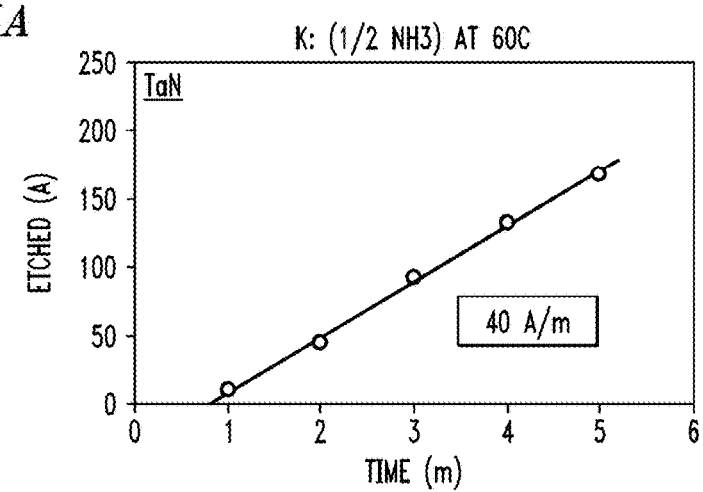
FIGS. 5A-5C are graphs illustrating etch rates for tantalum nitride, copper and cobalt, respectively, using an etch chemistry according to an exemplary embodiment of the present invention.
Figure 5B:
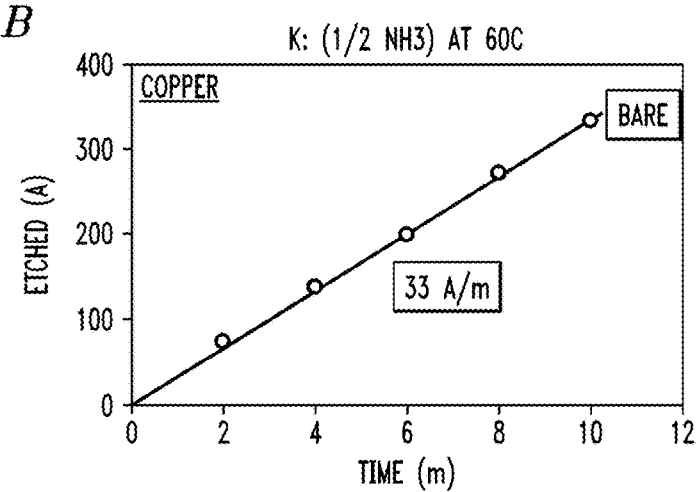
Figure 5C:
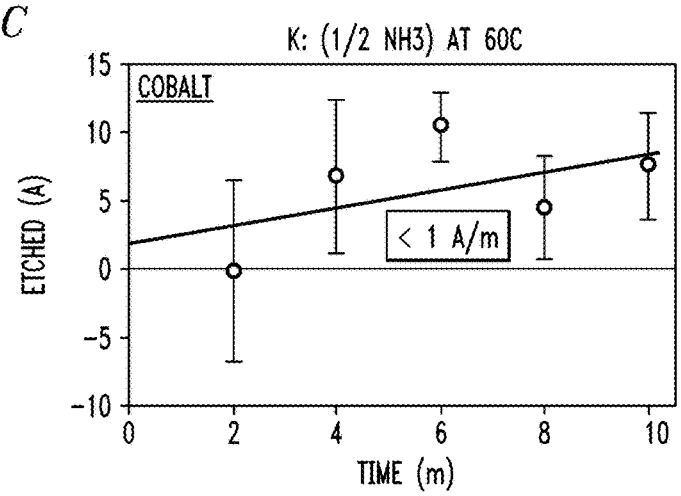

FIGS. 5A-5C are graphs illustrating etch rates for tantalum nitride, copper and cobalt, respectively, using the etch chemistry described in connection with FIG. 4B, according to an exemplary embodiment of the present invention. Referring to graph 510 in FIG. 5A, the etch rate of TaN at 60° C. using 15% $H_2O_2$+10 g/L BTA+0.1 M $NH_3$+0.5 g/L CDTA+KOH at a pH range of about 4 to about 12, is approximately 40 angstroms/minute. Referring to graph 520 in FIG. 5B, the etch rate of copper under the same conditions as in FIG. 5B is approximately 33 angstroms/minute. Referring to graph 530 in FIG. 5C, the etch rate of cobalt under the same conditions as in FIG. 5A is approximately <1 angstrom/minute. Accordingly, when using the etch chemistry described in connection with FIG. 4B, the TaN:Cu wet etch selectivity is approximately 1:1, and the TaN:Co wet etch selectivity is approximately 40:1 or higher. Therefore, both Cu and TaN can be selectively etched with respect to Co. In addition, although not shown in the graphs, the ULK etch rate is <1 Å/min, so TaN:ULK is 40:1 or higher.

Further processing similar to that described in connection with FIG. 1D and FIGS. 2C-2G can be performed on the structure of FIG. 4B to result in semiconductor devices the same or similar to those depicted in FIGS. 1D and 2G. For the sake of brevity, repetitive descriptions of such processing are not repeated.

Figure 6E:
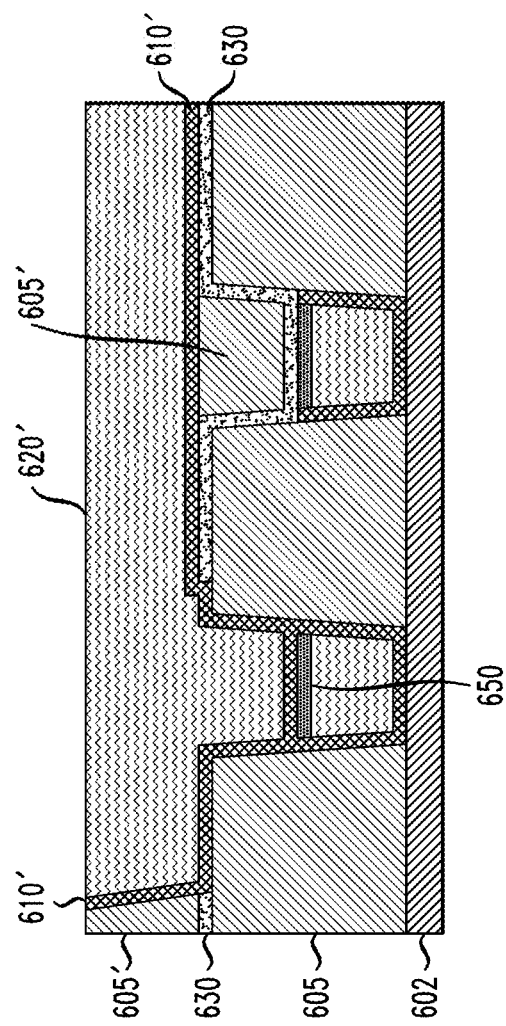

FIGS. 6A-6E are cross-sectional views illustrating a method of manufacturing a semiconductor device including FAVs according to an exemplary embodiment of the present invention. FIGS. 6A-6B illustrate structures and processing, which are the same or similar to the structure and processing shown in FIGS. 1A-1B. In accordance with an embodiment of the present invention, as can be seen in FIG. 6A, a dielectric layer 605, like dielectric layer 105, is deposited on the substrate 602 using, for example, deposition techniques including, but not necessarily limited to, CVD, PECVD, RFCVD, PVD, ALD, MBD, PLD, LSMCD, sputtering, and/or plating.

Interconnect structures including a barrier layer 610 and an electrically conductive contact 620 on the barrier layer 610, the same or similar to barrier and contact layers 110, 120, are formed in openings in the dielectric layer 605, using, for example, the same or similar techniques as those described in connection with barrier and contact layers 110, 120. After deposition of the contacts 620, a planarization process, such as CMP, is performed down to the barrier layer 610 so that like the structure in FIG. 1A, a planarized barrier layer 610 remains on a top surface of the dielectric layer 605, as well as on side and bottom surfaces of the openings in the dielectric layer 605 where the contacts 620 are formed.

Referring to FIG. 6B, like the contact portions 120, the contact portions 620 (e.g., copper) are recessed in the openings in the dielectric layer 605 using, for example, SC1/dHF. As an alternative to using SC1/dHF, the contact portion 620 may recessed by an etching technique, such as, for example, an RIE technique and/or wet etches as discussed above. The contacts 620 are recessed selective to the barrier layer 610 so that the barrier layer 610 remains adjacent areas where the contacts 120 were removed. The contacts 620 are also recessed selective to the dielectric layer 605 and may be recessed to depths ($d_5$, $d_6$), respectively from a top surface of the dielectric layer 605.

Referring to FIG. 6C, after recessing of the contacts 620 (e.g., copper contacts), instead of proceeding with removal of the barrier layers 610 as in FIG. 1C, cap layers 650 are deposited on the recessed portions of the contact layers 620. The cap layers comprise, for example, a metal, such as, but not necessarily limited to, cobalt, ruthenium, manganese (Mn), manganese oxide (MnO), manganese nitride (MnN), and cobalt tungsten phosphide (CoWP). The cap layers 650 can have a vertical thickness in the range of about 0.5 nm to about 8 nm. The cap layers 650 are deposited to prevent unwanted loss of portions of the contact layers 620 (e.g., copper contact layers) during subsequent removal of the barrier layers 610. The cap layers 650 can be deposited using, for example, techniques, including, but not necessarily limited to, CVD, PECVD, RFCVD, PVD, ALD, MBD, PLD, LSMCD, sputtering, and/or plating.

Referring to FIG. 6D, after deposition of the cap layers 650, similar to the processing described in connection with FIG. 1C, the barrier layer 610 (e.g., TaN) is removed from the top surface of the dielectric layer 605 and from the portions of the openings down to depths $d_5$ and $d_6$. The removal of the barrier layer 610 is selective to the contact layers 620 (e.g., Cu), the dielectric layer 605 (e.g., ULK material), and to the cap layers 650. For example, as noted in connection with FIG. 3C, the TaN:Co wet etch selectivity is approximately 48:1 or higher when using the etchant described in connection with FIG. 1C. As noted above, the cap layers 650 protect the contact layers 620 from inadvertent removal. According to an embodiment of the present invention, the barrier layer 610 is selectively etched using, for example, the same etchant as described in connection with FIG. 1C.

Further processing similar to that described in connection with FIG. 1D and FIGS. 2C-2G can be performed on the structure of FIG. 6D to result in the structure in FIG. 6E, which is similar to the semiconductor devices depicted in FIGS. 1D and 2G, except for the inclusion of the cap layers 650 on the recessed contact portions 620. For the sake of brevity, repetitive descriptions of such processing are not repeated, noting that like numerals refer to like elements in the specification.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
    a dielectric layer on a substrate;
    an opening in the dielectric layer;
    a first interconnect structure partially filling the opening in the dielectric layer, wherein the first interconnect structure comprises:
        a first barrier layer lining a bottom of the opening and sides of the opening up to a predetermined height below a top of the opening; and
        a first contact layer on the first barrier layer in the opening, wherein the first contact layer fills the opening to the predetermined height below the top of the opening; and
    a second interconnect structure on the first interconnect structure, wherein at least part of the second interconnect structure is in the opening, and includes a second contact layer on a second barrier layer;
    wherein the second barrier layer lines sides of a portion of the opening from a top of the opening to the first barrier layer.

2. The semiconductor device according to claim 1, further comprising a metal cap layer between the first and second interconnect structures.

3. The semiconductor device according to claim 2, wherein the metal cap layer is selected from the group consisting of cobalt, ruthenium, and manganese, manganese.

4. The semiconductor device according to claim 2, wherein the second barrier layer is formed on the metal cap layer.

5. The semiconductor device according to claim 1, wherein the first and second barrier layers comprise tantalum nitride and the first and second contact layers comprise copper.

6. A semiconductor device, comprising:
    a dielectric layer on a substrate;
    an opening in the dielectric layer;
    a first interconnect structure partially filling the opening in the dielectric layer, wherein the first interconnect structure comprises:
        a first barrier layer lining a bottom of the opening and sides of the opening up to a predetermined height below a top of the opening; and a first contact layer on the first barrier layer in the opening, wherein the first contact layer fills the opening to the predetermined height below the top of the opening; and
a second interconnect structure on the first interconnect structure, wherein at least part of the second interconnect structure is in the opening, and includes a second contact layer on a second barrier layer;
wherein the second contact layer fills the opening to the top of the opening.

7. The semiconductor device according to claim 6, further comprising a metal cap layer between the first and second interconnect structures.

8. A semiconductor device, comprising:
a dielectric layer on a substrate;
an opening in the dielectric layer;
a first interconnect structure partially filling the opening in the dielectric layer, wherein the first interconnect structure comprises:
    a first barrier layer lining a bottom of the opening and sides of the opening up to a predetermined height below a top of the opening; and
    a first contact layer on the first barrier layer in the opening, wherein the first contact layer fills the opening to the predetermined height below the top of the opening; and
a second interconnect structure on the first interconnect structure, wherein at least part of the second interconnect structure is in the opening, and includes a second contact layer on a second barrier layer;
wherein the second barrier layer is on a top surface of the dielectric layer.

9. The semiconductor device according to claim 8, further comprising a metal cap layer between the first and second interconnect structures.

10. The semiconductor device according to claim 9, wherein the second barrier layer is formed on the metal cap layer.

11. A semiconductor device, further comprising:
a dielectric layer on a substrate;
an opening in the dielectric layer;
a first interconnect structure partially filling the opening in the dielectric layer, wherein the first interconnect structure comprises:
    a first barrier layer lining a bottom of the opening and sides of the opening up to a predetermined height below a top of the opening; and
    a first contact layer on the first barrier layer in the opening, wherein the first contact layer fills the opening to the predetermined height below the top of the opening;
a second interconnect structure on the first interconnect structure, wherein at least part of the second interconnect structure is in the opening, and includes a second contact layer on a second barrier layer;
an additional opening in the dielectric layer;
a third interconnect structure partially filling the additional opening in the dielectric layer, wherein the third interconnect structure comprises:
    a third barrier layer lining a bottom of the additional opening and sides of the additional opening up to a predetermined height below a top of the additional opening; and
    a third contact layer on the third barrier layer in the opening, wherein the third contact layer fills the opening to the predetermined height below the top of the additional opening.

12. The semiconductor device according to claim 11, further comprising a dielectric cap layer on the third interconnect structure, wherein at least part of the dielectric cap layer is in the additional opening, and lines sides of a portion of the additional opening from a top of the additional opening to the third barrier layer.

13. The semiconductor device according to claim 12, further comprising a metal cap layer on the third interconnect structure between the dielectric cap layer and the third interconnect structure.

14. The semiconductor device according to claim 12, further comprising an additional dielectric layer on the dielectric cap layer and filling the additional opening to at least the top of the additional opening.

15. The semiconductor device according to claim 12, wherein a portion of the second barrier layer is formed on a portion of the dielectric cap layer.

16. The semiconductor device according to claim 15, wherein the portion of the second barrier layer that is formed on the portion of the dielectric cap layer is on a top surface of the dielectric layer.

17. A semiconductor device, comprising:
a dielectric layer on a substrate;
a plurality of openings in the dielectric layer;
a first interconnect structure partially filling the plurality of openings in the dielectric layer, wherein the first interconnect structure comprises:
    a first barrier layer lining a bottom and sides of each of the plurality of openings up to a predetermined height below a top of each of the plurality of openings; and
    a first contact layer on the first barrier layer in of each of the plurality of openings, wherein the first contact layer fills each of the plurality of openings to the predetermined height below the top of each of the plurality of openings;
a second interconnect structure on the first interconnect structure in a first opening of the plurality of openings, wherein at least part of the second interconnect structure is in the first opening of the plurality of openings, and includes a second contact layer on a second barrier layer; and
a dielectric cap layer on the first interconnect structure in a second opening of the plurality of openings, wherein at least part of the dielectric cap layer is in the second opening, and lines sides of a portion of the second opening from a top of the second opening to the first barrier layer in the second opening.

18. The semiconductor device according to claim 17, further comprising an additional dielectric layer on the dielectric cap layer and filling the second opening to at least the top of the second opening.

19. The semiconductor device according to claim 17, further comprising:
a first metal cap layer between the first and second interconnect structures in the first opening of the plurality of openings; and
a second metal cap layer on the first interconnect structure in the second opening of the plurality of openings between the dielectric cap layer and the first interconnect structure.

20. A semiconductor device, comprising:
a dielectric layer on a substrate;
an opening in the dielectric layer;
an interconnect structure partially filling the opening in the dielectric layer, wherein the interconnect structure comprises:

a barrier layer lining a bottom of the opening and sides of the opening up to a predetermined height below a top of the opening; and a contact layer on the first barrier layer in the opening, wherein the contact layer fills the opening to the predetermined height below the top of the opening;

a dielectric cap layer on the interconnect structure in the opening, wherein at least part of the dielectric cap layer is in the opening, and lines sides of a portion of the opening from the top of the opening to the barrier layer; and an additional dielectric layer on the dielectric cap layer and filling the opening to at least the top of the opening.

* * * * *